US011326083B2

(12) United States Patent
Prebe et al.

(10) Patent No.: US 11,326,083 B2
(45) Date of Patent: May 10, 2022

(54) HEAT STORAGE MATERTAL

(71) Applicant: HUTCHINSON, Paris (FR)

(72) Inventors: Arnaud Prebe, Amilly (FR); Bruno Dufour, Champagne sur Seine (FR); Fabrice Chopard, Saint Martin d'Heres (FR); Nicolas Garois, Amilly (FR); Philippe Sonntag, Avon (FR)

(73) Assignee: HUTCHINSON, Paris (FR)

( * ) Notice: Subject to any disclaimer, the term of this patent is extended or adjusted under 35 U.S.C. 154(b) by 539 days.

(21) Appl. No.: 15/566,273

(22) PCT Filed: Apr. 7, 2016

(86) PCT No.: PCT/EP2016/057554
§ 371 (c)(1),
(2) Date: Oct. 13, 2017

(87) PCT Pub. No.: WO2016/165999
PCT Pub. Date: Oct. 20, 2016

(65) Prior Publication Data
US 2018/0094180 A1  Apr. 5, 2018

(30) Foreign Application Priority Data
Apr. 13, 2015 (FR) ...................... 1553213

(51) Int. Cl.
*C09K 5/06* (2006.01)
*F28D 20/02* (2006.01)
*C08J 9/00* (2006.01)
*C08J 9/40* (2006.01)
*H01L 23/373* (2006.01)
*C08J 9/28* (2006.01)
*F28F 13/00* (2006.01)

(52) U.S. Cl.
CPC ............. *C09K 5/063* (2013.01); *C08J 9/0009* (2013.01); *C08J 9/0066* (2013.01); *C08J 9/286* (2013.01); *C08J 9/40* (2013.01); *F28D 20/023* (2013.01); *H01L 23/3733* (2013.01); *H01L 23/3737* (2013.01); *C08J 2201/0462* (2013.01); *C08J 2333/20* (2013.01); *F28F 2013/006* (2013.01); *Y02E 60/14* (2013.01)

(58) Field of Classification Search
CPC ......... C09K 5/063; C08J 9/0066; C08J 9/009; C08J 9/066; C08J 9/286; C08J 9/40; C08J 9/0009; C08J 2201/0462; C08J 2333/20; C04B 38/0038; C04B 38/0058; C04B 35/52; H01M 4/622; H01M 4/8817; H01M 4/8663–8673; H01M 4/133; H01M 4/1393; H01M 4/583; H01M 4/96; H01M 4/8605–8615; C08K 5/063; F28D 20/023; H01L 23/3733; H01L 23/3737; F28F 2013/006; Y02E 60/14
See application file for complete search history.

(56) References Cited

U.S. PATENT DOCUMENTS

| | | | |
|---|---|---|---|
| 3,676,222 A * | 7/1972 | Diebert | H01M 4/96 429/483 |
| 5,053,446 A | 10/1991 | Salyer | |
| 5,225,296 A * | 7/1993 | Ohsawa | C25B 11/031 429/213 |
| 5,456,852 A | 10/1995 | Isiguro | |
| 5,637,389 A | 6/1997 | Colvin et al. | |
| 5,916,478 A | 6/1999 | Nakahira et al. | |
| 6,119,573 A * | 9/2000 | Berens | B64G 1/50 102/293 |
| 6,306,957 B1 | 10/2001 | Nakano et al. | |
| 7,316,262 B1 | 1/2008 | Rini et al. | |
| 7,820,328 B1 | 10/2010 | Takeuchi et al. | |
| 9,676,941 B2 | 6/2017 | Van Eibergen et al. | |
| 2002/0004444 A1 | 1/2002 | Goela et al. | |
| 2002/0136887 A1 | 9/2002 | Penneau et al. | |
| 2002/0141932 A1 | 10/2002 | Klett et al. | |
| 2002/0147242 A1 | 10/2002 | Salyer et al. | |
| 2003/0092846 A1 | 5/2003 | Zhao et al. | |
| 2003/0157314 A1 | 8/2003 | Penneau et al. | |
| 2003/0175494 A1 | 9/2003 | Penneau et al. | |

(Continued)

FOREIGN PATENT DOCUMENTS

EP  0 693 542 A1  1/1996
FR  2 759 087 A1  8/1998

(Continued)

OTHER PUBLICATIONS

"Vinylene carbonate". Chemical Book. Accessed at: https://www.chemicalbook.com/ChemicalProductProperty_EN_CB9119200.htm#:~:text=Vinylene%20carbonate%20Properties,162%20%C2%B0C(lit.) (Year: 2017).*
Jun. 23, 2016 Search Report issued in International Patent Aplication No. PCT/EP2016/057554.
Oct. 17, 2017 International Preliminary Report on Patentability issued in International Patent Application No. PCT/EP2016/057554.
3M "Jumbo de Esponja Extra Fuerte 86." (with Abstract).
Feb. 20, 2020 Office Action issued in U.S. Appl. No. 15/566,238.
Jan. 28, 2020 Office Action issued in Japanese Patent Application No. 2017-553213.
Elmet, Tungsten, W, accessed 2020 (Year: 2020).

(Continued)

*Primary Examiner* — Michael M Dollinger
*Assistant Examiner* — Christina H. W. Rosebach
(74) *Attorney, Agent, or Firm* — Oliff PLC

(57) ABSTRACT

The invention relates to a material including a support consisting of a porous composite material including at least one polymer phase forming a binder based on at least one polymer selected from thermoplastic polymers, elastomers, and elastomer thermoplastics, and at least one filler selected from thermally conductive fillers, the pores of the support consisting of the porous composite material being partially or entirely filled with at least one phase-change material. The invention also relates to a method for producing said material.

17 Claims, No Drawings

(56) References Cited

U.S. PATENT DOCUMENTS

| | | | |
|---|---|---|---|
| 2003/0220432 A1* | 11/2003 | Miller | C08K 3/04 524/439 |
| 2005/0020768 A1 | 1/2005 | Pause | |
| 2005/0067346 A1 | 3/2005 | Noack et al. | |
| 2006/0069171 A1 | 3/2006 | Prokopowicz et al. | |
| 2006/0121269 A1 | 6/2006 | Miller et al. | |
| 2008/0226984 A1 | 9/2008 | Lee et al. | |
| 2010/0204380 A1 | 8/2010 | Kim et al. | |
| 2011/0009544 A1 | 1/2011 | Funahashi | |
| 2011/0040007 A1 | 2/2011 | Chandrasekhar et al. | |
| 2012/0015229 A1 | 1/2012 | Ohashi et al. | |
| 2012/0025131 A1 | 2/2012 | Forero | |
| 2012/0228542 A1 | 9/2012 | l'Abee et al. | |
| 2013/0298991 A1 | 11/2013 | Parker et al. | |
| 2014/0039082 A1 | 2/2014 | Peterson et al. | |
| 2016/0030625 A1 | 2/2016 | Mrozek et al. | |
| 2016/0052199 A1 | 2/2016 | Hansen et al. | |
| 2016/0319174 A1* | 11/2016 | Razack | B05D 1/18 |

FOREIGN PATENT DOCUMENTS

| | | |
|---|---|---|
| FR | 2 759 089 A1 | 8/1998 |
| FR | 2 993 894 A1 | 1/2014 |
| JP | 2001-81446 A | 3/2001 |
| WO | 01/21551 A1 | 3/2001 |
| WO | 03/085346 A1 | 10/2003 |
| WO | 03/099427 A1 | 12/2003 |
| WO | 2005/071001 A1 | 8/2005 |
| WO | 2006/023860 A2 | 3/2006 |
| WO | 2006/062610 A2 | 6/2006 |
| WO | 2007/040395 A1 | 4/2007 |
| WO | 2007/107171 A1 | 9/2007 |
| WO | 2009/064883 A1 | 5/2009 |
| WO | 2009/115512 A1 | 9/2009 |
| WO | WO-2011035689 A1 * | 3/2011 ............ C08J 5/2275 |
| WO | 2012/000935 A1 | 1/2012 |

OTHER PUBLICATIONS

Aug. 20, 2020 Office Action issued in U.S. Appl. No. 15/566,238.

Technical Products, Inc., "Boron Nitride Grade A Material Specifications," 2017.

Technical Products, Inc., "Boron Nitride Grade A Material Specifications," Wayback Machine, 2017.

Feb. 10, 2021 Office Action issued in U.S. Appl. No. 15/566,238.

Jul. 8, 2016 Search Report issued in International Patent Application No. PCT/EP2016/057555.

Oct. 17, 2017 International Preliminary Report on Patentability issued in International Patent Application No. PCT/EP2016/057555.

* cited by examiner

HEAT STORAGE MATERIAL

The invention relates to a novel heat storage material having improved properties, this material comprising a support made of a thermally conductive porous material, the pores of which are filled with a phase-change material (PCM). The invention also relates to a process for producing this material and to the uses thereof.

PRIOR ART

Materials which allow heat storage are used in various applications. They are found in fields such as temperature control by inertia in the building industry or else in the exploitation of renewable energy sources of intermittent nature. It is also possible to envision exploiting the heat generated by electrical equipment such as computers, servers, or else batteries, provided that the material capable of storing energy is also electrically insulating.

Three processes are mainly found in the literature for producing a material which allows the storage of thermal energy.

The first process consists in encapsulating the PCM or in adsorbing it onto a support before it is formulated in a composition of material.

For example, US 20130298991 describes the use of mineral fillers which adsorb the PCM. The mixture is then formulated with a binder for cement and an aqueous solvent in order to produce a cement containing the PCM. The adsorption onto the filler is an additional step in the production of the cement.

WO 03/099427, U.S. Pat. Nos. 5,456,852, 5,916,478 and WO 2007/107171 describe methods for encapsulating PCM so as to form particles which have a PCM core and a polymer coating. These particles are then dispersed in a support. In all cases, no thermally conductive filler is incorporated into the support and the thermal conductivity of these materials is not evaluated. This method has the drawback of requiring complex steps of synthesis with the polymer shells. The PCM-based materials encapsulated in polymer matrices are not easily recyclable.

A second process involves directly mixing the PCM with a binder, or mixing the PCM with a monomer which is then polymerized so as to form a binder, in the presence of the PCM. The binder provides the cohesion of the material.

For example, WO 03085346 describes a wall lining containing particles of PCM which are adsorbed in a layer of wall lining of polymeric type, or attached to an adsorbent layer of the wall lining.

EP 693542 describes a composition having as base PCMs, water and crosslinkable polymers and which swells in water. The mixture gives a composition in which the PCM is dispersed in a hydrogel. WO 2007/040395 describes the polymerization of monomers of which at least one is directly bonded to a PCM.

In all these materials, the PCM is linked to a support which is not thermally conductive, and thus the propagation of the heat within the support from/toward the PCMs is very reduced. This design of the material leads to a low reactivity of the system to changes in temperature.

FR 2 993 894 and US 20050020768 describe materials obtained from a matrix based on silicone and PCM. FR 2 993 894 teaches the incorporation of thermally conductive fillers into the silicone matrix. However, since the amounts of thermally conductive fillers are low, the thermal conductivity values obtained are also low. The prior art materials that are obtained from liquid precursors which are formulated and then crosslinked are not recyclable. Finally, the morphology of the prior art materials is different than that of the materials of the invention, which have the particular feature of consisting of a porous support of which the pores receive the PCM. US 20050020768 teaches a dispersion of PCM which is fine and divided in a crosslinked silicone matrix, while the process of the invention provides a material comprising a continuous phase of PCM if desired.

WO 2006/62610 describes the mixture of PCM with thermoplastic elastomer materials of the type very low density polyethylene, ethylene/propylene copolymer and also styrene/butadiene/styrene and styrene/ethylene/butadiene/styrene copolymers. Non thermally conductive fillers such as silicates are used in the production of the material in order to improve the retention of the PCM in the polymer. U.S. Pat. No. 5,053,446 describes the obtaining of a composite based on a polyolefin and a PCM and from 10% to 50% by weight of fillers such as silica or calcium and silicon metaphosphate which make it possible to improve the filler retention by the material. No thermally conductive filler is used, the thermal conductivity of the material is not mentioned.

A third process comprises, in a first step, the production of a porous structure in which, in a second step, the PCM is introduced. Thus, US 2002/0147242 describes the obtaining of an open-pore polyurethane foam, the pores of which are filled with PCM. US 2002/0147242 teaches that the porosity must be maximized in terms of volume in order to allow filling with a high amount of PCM.

U.S. Pat. No. 5,637,389 describes the joint use of a foam of encapsulated polymer and PCM, in the production of a material of thermally insulating nature which can be used in shoe soles. No thermally conductive filler is used.

US 2014/039082 describes thermally conductive cellular foams comprising a flexible cellular foam and metal particles. These materials are intended to be used as mattresses. PCMs can be incorporated into the foam, but it is not indicated whether they are incorporated into the pores or into the polymer matrix itself. The foams are prepared using two-component polymer precursor systems, by means of surfactants and blowing agents. They are therefore non-convertible, non-thermoplastic polymers.

US 2003/0220432 describes a thermally conductive thermoplastic material comprising a base thermoplastic elastomer matrix, a thermally conductive filler and a PCM. This material can be used as thermal interface in electronics.

The information sheet of the product Jumbo de Esponja Extra Fuerte 86 describes a sponge comprising metal fillers. The matrix is formed from nylon fibers forming a nonwoven three-dimensional mesh, said fibers being bonded by an epoxy resin. These sponges are neither thermoplastic nor convertible.

U.S. Pat. No. 7,316,262 describes an apparatus capable of storing thermal energy. It comprises a support made of a material with high thermal conductivity, containing a PCM. The support may be a matrix made of graphite, of metal foam, but also of plastic. The experimental part is carried out with a graphite foam as support. This document does not disclose a support made of porous composite material comprising a polymer phase forming a binder based on at least one polymer chosen from thermoplastic polymers, elastomers and thermoplastic elastomers.

It is known to incorporate thermally conductive fillers into a polymer matrix. However, the incorporation of thermally conductive fillers in large amount into a polymer matrix presents difficulties: the more fillers are introduced into a polymer matrix, the higher the viscosity of the mixture and the more difficult it is to effectively convert the mixture by means of the usual methods of plastics technology. This problem has been solved in various ways in the prior art by incorporating fillers in limited amounts into the final composite, thereby also limiting the thermal conductivity, through the use of low-viscosity polymer precursors which are then crosslinked, or else through the use of a binder polymer in solution in a solvent which is then evaporated off. The preparation of a thermally conductive material using solvent presents problems of storage, handling and recycling of large amounts of solvents, which represent serious drawbacks in environmental and health terms when these are organic solvents. The production of a composite polymer material using solvent can make it possible to obtain a porous material, but of which the porosity is difficult to control and which has a thickness that is necessarily reduced to films of a few hundred micrometers. A thermally conductive material prepared from liquid precursors which are then crosslinked is neither convertible nor recyclable. Moreover, the variety of polymer bases which can be used in these processes is limited and the process times are long. This type of process does not make it possible to obtain a porous material. Finally, such materials are not very conformable and therefore of limited interest in certain applications. Fillers functionalized with groups which allow them to be incorporated in high amounts have the drawback of requiring a specific production step, which represents an additional cost for the material.

The contents of conductive fillers that can be attained using a melt process with conventional polymers and mineral or non-grafted carbon-based fillers are, at the current time, less than 80% by volume. Furthermore, the melt processes of the prior art result in a dense, non-porous composite.

In applications in which it is sought to rapidly capture the heat energy of a heat source, for instance in electronic devices, it is necessary to have a material which has a high thermal conductivity. This is because, if the heat given off is not captured or rapidly propagated to a cold source, there are risks of heat accumulation that can lead to the decomposition of the parts connected to the heat source, with the possible result that a fire will be started.

Likewise, in applications with storage of thermal energy, it is necessary to be able to transfer the heat energy to the PCM efficiently and rapidly in order to increase the reactivity of the system in terms of storage and release of this energy. Depending on the applications, the thermally conductive materials must also have a high conformability so as to closely match the shapes of the parts with which they are in contact. This property makes it possible to optimize the heat flows.

US20020141932 and WO 2001/21551 describe thermally conductive porous structures based on graphite and on graphitized pitch. Thermal conductivities of at least 50 W/m·K are described. The material described is obtained from pitch, by implementing steps of graphitization of the pitch: high temperatures (>1000° C.) and non-oxidizing atmosphere. This porous material is then filled with PCM. Boron nitride is used in the production of the material in US20020141932, but it is employed in vaporization as agent for demolding the graphitized material and not as a filler in the material. The graphite nature of the materials taught by these documents confers thereon an electrically conductive nature. They are non-deformable rigid materials, contrary to the materials with a polymer support of the invention. Repeated phase changes during use are capable of causing volume expansions which themselves lead to a risk of degradation and of loss of cohesion in these prior art materials. Finally, the graphite nature of these materials prevents them being recycled.

The objective of the invention has been to provide a thermally conductive material capable of storing energy, which overcomes the drawbacks of the prior art.

In particular, it is sought to develop a process which results in a porous thermally conductive material, the porosity of which can be filled with PCMs. It has also been sought to develop materials which are prepared by the melt process, which are optionally recyclable and which incorporate high amounts of thermally conductive fillers while at the same time having satisfactory cohesion. It has been sought to develop a process which can be carried out with mineral fillers or carbon-based fillers without a step of functionalizing these fillers being necessary. It has also been sought to obtain a material which is conformable.

SUMMARY OF THE INVENTION

A first subject of the invention is a material comprising:
a support made of porous composite material comprising at least (A) a polymer phase forming a binder based on at least one polymer chosen from thermoplastic polymers, elastomers and thermoplastic elastomers, and (B) one or more fillers chosen from thermally conductive fillers,
the pores of the support made of porous composite material being partially or totally filled with:
at least one phase-change material.

A subject of the invention is also a process for producing this material, comprising:
producing a support made of porous composite material comprising at least (A) one polymer phase and (B) one or more fillers chosen from thermally conductive fillers,
partially or totally filling the porosity of the support made of porous composite material with at least one phase-change material.

The invention also relates to a process for producing a thermally conductive porous carbon-based material, this process comprising
producing a porous carbon-based support comprising at least (A) one polymer phase and (B) one or more fillers chosen from thermally conductive fillers,
partially or totally filling the porosity of the porous carbon-based support with at least one phase-change material,
in which the production of the porous carbon-based support comprises the following steps:
a) hot-melt mixing of the polymer phase (A), the fillers (B), and a sacrificial polymer phase (C), so as to obtain a mixture,
b) forming of the mixture,
c) eliminating of the sacrificial polymer phase,
d) pyrolysis or graphitization, The invention also relates to the use of the material defined above, or of the material obtained by means of one of the processes defined above, in one of the following applications:
heat dissipator in electronic equipment,
energy storage support.

According to one preferred embodiment, the thermally conductive fillers (B) represent at least 60% by weight relative to the sum of the weights of the polymer phase (A) and of the fillers (B).

According to one preferred embodiment, the phase-change material forms a continuous phase in the porosity of the support made of porous composite material.

According to one preferred embodiment, the polymer phase forming a binder is based on at least one polymer chosen from: polyacrylonitrile, polyolefins, halogenated polymers, acrylic polymers, acrylates, methacrylates, vinyl acetates, polyethers, polyesters, polyamides, aromatic polymers, hydrogenated acrylonitrile-butadiene, ethylene/alkyl acrylate copolymers, polyisoprene, and rubbers.

According to one preferred embodiment, the fillers are chosen from: aluminum nitride, boron nitride, magnesium silicon nitride, silicon carbide, diamond, graphite, graphene, carbon nanotubes (CNTs), carbon black, metal fillers such as aluminum, copper or silver, and mixtures thereof.

According to one preferred embodiment, the porosity represents at least 40% by volume relative to the total volume of the support made of porous composite material.

According to one preferred embodiment, the phase-change material is chosen from hydrocarbon-based chains.

According to one preferred embodiment, the production of the support made of porous composite material comprises the following steps:
a) hot-melt mixing of the polymer phase (A), the fillers (B) and a sacrificial polymer phase (C) so as to obtain a mixture,
b) forming the mixture,
c) eliminating the sacrificial polymer phase.

According to one preferred embodiment, the sacrificial polymer phase (C) represents at least 15% by weight, preferably from 20% to 80% by weight of the total weight of the mixture of step a).

According to one preferred embodiment, step a) is carried out in an internal mixer or in an extruder.

According to one preferred embodiment, step is carried out by heat decomposition of the sacrificial polymer phase.

According to one preferred embodiment, the sacrificial polymer phase is based on at least one polymer chosen from polyalkene carbonates, preferably from polyethylene carbonates and polypropylene carbonates.

According to one preferred embodiment, step b) comprises a shaping in the form of a film.

According to one preferred embodiment, the process also comprises a compression step d) at the end of step c).

DETAILED DESCRIPTION

The invention is based on a material comprising a support made of thermally conductive porous composite material comprising at least (A) one polymer phase based on a polymer that is convertible by the melt process and (B) thermally conductive fillers. This porous structure is partially or totally filled with at least one PCM in order to generate a thermal energy storage reservoir.

It has been possible to obtain this heat storage material which has a high thermal conductivity, and also a high latent heat, by means of a process which implements conventional plastic conversion methods. In a first step, a thermally conductive material is produced. This material has good mechanical cohesion by virtue of the use of a polymer phase as a binder, and a high thermal conductivity by virtue of the presence of thermally conductive mineral fillers. This material has a porosity that is controlled in terms of amount, of pore dimension and of morphology by virtue of the use of a sacrificial phase (C). The porosity of this material is then totally or partially filled with a phase-change material (PCM), which provides the heat storage function.

This result has been obtained by means of a method which makes it possible to incorporate, directly by the melt process and by conventional plastic conversion methods, very high contents of thermally conductive mineral or carbon-based fillers into the final material. The composition is chosen from the viewpoint of the production process employed and of the final application of the material. The process of the invention also makes it possible to orient the fillers with an aspect ratio, by relying on the implementation parameters and, where appropriate, on an additional step of recompression. The process of the invention has made it possible to produce by the melt process thermally conductive materials which contain a content of mineral or carbon-based fillers greater than 80% by weight without prior modification of the surface of the fillers or the use of a coupling agent or of solvent, these materials being usable, as they are, for filling with a PCM.

The mixing, the dispersion and the uniform distribution of the binding polymer and of the sacrificial phase and of the various mineral or carbon-based fillers are carried out by implementing the melt process. An optional pyrolysis or graphitization of the binding polymer is possible in a second step in order to optimize the performance levels, as a function of the application envisioned. The controlling of the porosity in terms of size, volume and morphology is carried out by controlling the mixing parameters (screw profile, etc.) during the implementation of the process. Secondly, the material can be subjected to a compression step which leads to a reduction in the pore volume. The controlling of the porosity is adjusted according to the application envisioned.

In the present description, the expression "polymer" denotes both homopolymers and copolymers. It includes polymer blends, oligomers, and mixtures of monomers, of oligomers and of polymers.

The expression "essentially consists of" followed by one or more characteristics means that components or steps which do not significantly modify the properties and characteristics of the invention can be included in the process or the material of the invention, in addition to the components or steps explicitly listed.

The Support Made of Thermally Conductive Porous Composite Material

The support made of thermally conductive porous composite material comprises a polymer phase forming a binder and thermally conductive fillers. It is obtained by using a sacrificial phase.

The Polymer Phase Forming a Binder:

The support made of porous composite material of the invention consists in particular of a polymer phase forming a binder and providing its cohesion. The polymer phase may be of any nature provided that it can be converted by the melt process and that it is compatible with the sacrificial phase chosen.

The polymer phase forming a binder advantageously has a melting point that is at least 20° C. lower than the decomposition temperature of the sacrificial phase so as to enable the conversion by the melt process of the mixture. The polymer phase forming a binder is solid at ambient temperature (at around 20-25° C.) since it must be able to be formed and will constitute the binder of the final material.

The compatibility between the polymer phase forming a binder and the sacrificial polymer phase is evaluated in a manner well known to those skilled in the art by melt-mixing the materials and by observing whether phase separation occurs or whether the mixture is substantially uniform. In order to implement the process and to obtain a satisfactory material, it is necessary to avoid phase macroseparation between the binding polymer and the sacrificial polymer during the implementation, which macroseparation would result in the presence of a non-dispersed pure polymer phase greater than a few tens of μm in size.

In order to carry out this mixing, various parameters make it possible, in a known manner, to modulate the compatibility between the two phases. Mention may be made, for example, and in a non-limiting manner, of: choice of the equipment, such as screw profile; proportion of the phases; compatibilizing agent. Reference may be made to a general handbook such as: "Mixing and Compounding of Polymers Theory and Practice", 2nd edition, Ica Edition, Manas-Zloczower, which describes in detail the principal knowledge about polymer blends.

The choice of the two phases makes it possible to control the implementation of the process, but also the properties of the final porous composite support, such as its integrity, its porosity, its conformability.

The nature of the material which constitutes the polymer phase forming a binder is chosen according to the final properties that are expected of the material, for example its plasticity, its mechanical properties.

According to one embodiment of the invention, pyrolyzable and/or graphitizable polymers are used in the polymer phase forming a binder. After an additional step of pyrolysis or of graphitization, these polymers make it possible to obtain carbon-based materials which have a thermal conductivity.

The polymer phase which forms a binder comprises polymers and optionally additives. Preferably, the polymers represent at least 75% by weight of the polymer phase forming a binder, advantageously at least 90%.

Advantageously, the polymers used in the process of the invention and which are part of the composition of the final material (before any optional pyrolysis) are chosen from: thermoplastics, elastomers and thermoplastic elastomers. Mention may, for example, be made of: polyacrylonitrile, polyolefins, halogenated polymers, acrylic, acrylate, methacrylate polymers, vinyl acetates, polyethers, polyesters, polyamides, aromatic polymers or else elastomeric polymers, for instance hydrogenated acrylonitrile-butadiene (HNBR), ethylene/alkyl acrylate copolymers, polyisoprene or other rubbers.

The polymer phase forming a binder is based on at least one polymer chosen from: thermoplastics, elastomers, and thermoplastic elastomers, which means that the thermoplastic polymers, elastomers and thermoplastic elastomers represent at least 95% by weight of the polymers of the polymer phase forming a binder, advantageously at least 98%.

According to one preferred embodiment of the invention, the polymer phase forming a binder comprises at least 50%, preferentially at least 90%, even better still at least 95% by weight of at least one polymer chosen from polyacrylonitrile, hydrogenated acrylonitrile-butadiene, and blends thereof.

Among the additives that can be used in the polymer phase forming a binder, mention may be made of additives which are chosen for their function in the final material, for instance: agents which improve the fire resistance or oxidation resistance or else crosslinking agents, such as bifunctional organic compounds, organic peroxides or sulfur-containing compounds (for the crosslinking of rubbers), co-agents such as triallyl cyanurate. The use of these additives is useful without being required for the invention and depends directly on the intended application.

The Sacrificial Polymer Phase:

The sacrificial polymer phase is composed of materials which have the property of decomposing during the application of a chosen external stress, for instance by increasing the temperature or by dissolving in a solvent. It must be possible for the elimination or extraction of the sacrificial phase to be carried out without having an impact on the remainder of the material. It is preferable to use, as sacrificial material, a compound which leaves few or no residues during the decomposition. In the context of the present invention, the presence of small amounts of sacrificial material in the pores of the porous composite support can improve the wettability of this support and thus facilitate its filling with the PCM.

Advantageously, the sacrificial polymer phase is solid at ambient temperature (at around 20-25° C.) so as to enable the forming of the composition.

Preferably, a sacrificial phase which can be extracted by heat decomposition is chosen, and preference is given to polymers which have a clear degradation temperature known from the literature, while being sure that the degradation temperature of the sacrificial phase is at least 20° C. lower than the degradation temperature of the polymer(s) chosen for the polymer phase forming a binder. Among the polymers that can be eliminated by increasing the temperature, mention may be made of polyalkene carbonates, for instance polyethylene carbonates and polypropylene carbonates. Generally, these materials have the advantage of decomposing with a moderate or zero volume expansion. Thus, the volume of the part formed is not affected or is affected little by the sacrificial phase decomposition step. In the presence of certain fillers such as graphite, the use of polyalkene carbonates can nevertheless sometimes result in volume expansion. In order to improve the fluidity of the intermediate polymer material and to facilitate the implementation of the process, in a manner known to those skilled in the art, use may be made of a mixture of polyalkene carbonates of different molar masses.

According to another embodiment, the sacrificial polymer phase can be extracted with a solvent and is based on at least one liquid-extractable sacrificial polymer, preferably chosen from: polyethylene glycols, polypropylene glycols and mixtures thereof.

The sacrificial polymer phase comprises polymers and optionally additives. Preferably, the polymers represent at least 95% by weight of the sacrificial polymer phase, advantageously at least 98%.

Advantageously, the sacrificial polymer phase is based on at least one polymer chosen from polyalkene carbonates, which means that the polyalkene carbonates represent at least 95% by weight of the sacrificial polymer phase, advantageously at least 98%.

According to one preferred embodiment of the invention, the polyethylene carbonates and the polypropylene carbonates represent at least 95% by weight of the sacrificial polymer phase, advantageously at least 98%.

Among the additives that can be used in the sacrificial polymer phase, mention may be made of photoacid generators which act as additives that assist with the decomposition of the sacrificial phases. Such products are described in Gupta M., Jayachandran P., Khol P., Photoacid generators for catalytic decomposition of polycarbonate, *Journal of applied polymer science,* 2007, vol. 105, p. 2655-2662, for polypropylene carbonate for example. The use of these photoacids in the sacrificial polymer phase makes it possible to reduce the degradation temperatures. They are thus useful without being required for the invention.

The Fillers:

According to the invention, thermally conductive fillers are used in the support made of porous composite material of the invention. The thermally conductive filler is advantageously chosen from those having a thermal conductivity greater than or equal to 5 W/mK.

The intrinsic thermal conductivity of known fillers is described, for example, in "Thermal conductivity of Nonmetallic Solids," Y. S. Touloukian, R. W. Powell, C. Y. Ho, and P. G. Klemans, IFI/Plenum: New York-Washington, 1970, or in "Thermal Conductivity-Theory, Properties and Applications," T. M. Tritt, published by Kluwer Academic/Plenum Publishers: New York, 2004.

Preferably, the thermally conductive filler has an intrinsic thermal conductivity greater than or equal to 10 W/mK, more preferably greater than or equal to 25 W/mK, advantageously greater than or equal to 50 W/mK.

Thermally conductive fillers which can be used in the invention are, for example: ALN (aluminum nitride), BN (boron nitride), $MgSiN_2$ (magnesium silicon nitride), SIC (silicon carbide), graphite, graphene, carbon nanotubes (CNTs), carbon nanofibers, carbon black, diamond, metal fillers such as aluminum, copper or silver, or a combination thereof.

It should be emphasized that some of these fillers, such as metal fillers, graphite, graphene, carbon nanotubes (CNTs), carbon nanofibers or carbon black, can also be electrically conductive. When it is desired to obtain an electrically insulating material, the use of such fillers is avoided. In this case, use is preferably made of a filler which has a resistivity greater than or equal to $10^3$ Ohm·cm, such as aluminum nitride, boron nitride, magnesium silicon nitride or silicon carbide.

The Additives:

In addition to the additives intended to modify the properties of the support made of porous composite material, and those intended to facilitate the elimination of the sacrificial phase, it is possible to add specific additives to the composition in order to improve and/or optimize the process for producing the materials, for instance compatibilizing agents. These additives which facilitate the implementation of the process can be incorporated beforehand into one or the other of the polymer phases, or with the fillers, or they can be incorporated independently.

The Process for Preparing a Support Made of Porous Composite Material:

The process of the invention is based on the use of a sacrificial polymer phase in a melt process, allowing at the same time plasticization, better fluidity of the material during the processing and cohesion in the molten state, but also the creation of a controlled porosity. For example, an open porosity may be desired in order to reduce the density of the material while at the same time ensuring a high thermal conductivity and the capacity to integrate therein a continuous PCM phase. The porosity can be controlled directly through the amount of sacrificial material introduced or through an optional compression of the material after forming and elimination of the sacrificial phase. It should be noted that the process according to the invention allows both short process times, typical of the conventional processes of plastics technology, such as extrusion, but also the use of steps requiring a cohesion in the molten state, such as extrusion/calendering. It should also be emphasized that the capacity of the mixture to be converted is maintained after forming, provided that no extraction or pyrolysis has been carried out.

This process comprises the following steps:

a) hot-melt mixing of the polymer phase forming a binder (A), of the fillers (B) and of the sacrificial polymer phase (C) so as to obtain a mixture, b) forming of the mixture, c) eliminating of the sacrificial polymer phase.

Step a) can be carried out in a known manner in any type of equipment which makes it possible to homogenize the composition while at the same time heating it. Mention may in particular be made of an internal mixer or an extruder. Compared with the prior processes, the process of the invention has numerous advantages, and in particular the mixing step is carried out without solvent. The polymer phase forming a binder is homogeneously dispersed in the continuous sacrificial polymer phase, or else it forms a co-continuous phase with the latter.

In order to facilitate the obtaining of a homogeneous mixture, the sacrificial polymer phase can for example be used in the form of granules of number-average size greater than 1 mm.

The heating is controlled so as to bring the polymer phases to melting without decomposing the sacrificial phase or at a temperature at which the sacrificial phase decomposes very slowly (over a period of greater than 1 h). Advantageously, the heating in step a) is controlled so as to bring the mixture to a temperature that is at least 20° C. higher than the glass transition temperature or the melting temperature of the polymers of the polymer phase forming a binder.

The forming step is adjusted according to the final shape and to the dimensions that it is desired to confer on the object. The shaping can consist, for example, of one or more steps chosen from: extrusion, blow-molding, injection-molding, molding, calendering, kneading, and combinations thereof.

One advantage of the process of the invention lies in the possibility, when fillers with an aspect ratio are used, of orienting these fillers. The creation of a porosity contributes in itself to the orientation of these fillers. Moreover, the passing through an extrusion die under chosen pressure conditions makes it possible to confer an orientation on such fillers. The compression and/or the calendering can also contribute to the orientation of the fillers. Such an orientation of fillers in the porous composite material results in an asymmetry of the properties, and makes it possible to increase the thermal conductivity properties in one direction of the material.

The process of the invention also makes it possible to obtain self-supported objects of varied shapes, and not only coatings attached to a support.

At the end of step a) or b), a polymer composition which is an intermediate composition of the process of the invention is obtained. It may be in the molten state or already formed. It is a precursor of the porous composite support. This composition comprises at least:

(A) a polymer phase that is convertible by the melt process, advantageously based on polymers chosen from thermoplastic polymers, elastomers and thermoplastic elastomers, (B) a filler chosen from thermally conductive fillers, (C) a sacrificial polymer phase.

Advantageously in this composition, the fillers (B) represent at least 50%, preferentially at least 70%, even better still at least 80% by weight relative to the sum of the weights of the polymer (A) and of the fillers (B).

Advantageously in this composition, the sacrificial polymer phase (C) represents at least 15% by weight relative to the sum of the weights of (A), (B) and (C).

Advantageously, the polymer composition comprises, or better still essentially consists of, by weight relative to the total weight of the composition:
- (A) 1% to 15% of polymer phase based on polymers chosen from thermoplastic polymers, elastomers and thermoplastic elastomers,
- (B) 40% to 70% of filler(s) chosen from thermally conductive fillers,
- (C) 20% to 80% of sacrificial polymer phase.

This polymer composition can be prepared and formed directly in the form desired for the use (film, casing, etc.).

Alternatively, an embodiment is envisioned in which the composition is prepared (homogeneous melt-mixing of the components (A), (B) and (C)) and formed into granules for example. This composition is then easily reintroduced into the process of the invention in step a). This embodiment makes it possible to provide a ready-to-use composition which does not require any metering out of the components and avoids the handling errors associated with the introduction of the components into the mixer.

The sacrificial polymer phase is eliminated after forming of the composite polymer composition substantially without leaving residues. This step can be carried out in a known manner by increasing the temperature, for example in a furnace. It can also be carried out by other means, for instance by dissolving the sacrificial phase using a solvent.

In addition to the steps described above, the process of the invention can comprise other steps. In particular, according to one embodiment of the invention, it comprises one or more forming steps at the end of step c), and in particular cutting the material to the desired dimensions, and a compression which makes it possible to reduce the porosity. The compression can for example be carried out by means of a plate press or by calendering. Optional crosslinking of the phase forming a binder is possible in order to optimize the mechanical properties and the cohesion of the composition if a subsequent conversion is not envisioned.

Advantageously, the support made of porous composite material comprises, or better still essentially consists of, by weight relative to the total weight of the support:
- 3% to 40% of at least one polymer chosen from thermoplastic polymers, elastomers and thermoplastic elastomers,
- 60% to 97% of at least one filler chosen from thermally conductive fillers,
- 0% to 5% of one or more additives, or of decomposition residues of the sacrificial phase.

Preferentially, the support made of porous composite material comprises, or better still essentially consists of, by weight relative to the total weight of the support:
- 3% to 20% of at least one polymer chosen from thermoplastic polymers, elastomers and thermoplastic elastomers,
- 80% to 97% of at least one filler chosen from thermally conductive fillers,
- 0% to 2% of one or more additives, or of decomposition residues of the sacrificial phase.

Even more preferentially, the support made of porous composite material comprises, or better still essentially consists of, by weight relative to the total weight of the support:
- 4% to 10% of at least one polymer chosen from thermoplastic polymers, elastomers and thermoplastic elastomers,
- 90% to 96% of at least one filler chosen from thermally conductive fillers,
- 0% to 1% of one or more additives, or of decomposition residues of the sacrificial phase.

According to one embodiment of the invention, the support made of porous composite material comprises, or better still essentially consists of, by weight relative to the total weight of the support:
- 3% to 40% of at least one polymer chosen from polyacrylonitrile, polyolefins, halogenated polymers, acrylic polymers, acrylates, methacrylates, vinyl acetates, polyethers, polyesters, polyamides, aromatic polymers, hydrogenated acrylonitrile-butadiene, ethylene/alkyl acrylate copolymers, polyisoprene, and rubbers,
- 60% to 97% of at least one filler chosen from aluminum nitride, boron nitride, magnesium silicon nitride, silicon carbide, diamond, and mixtures thereof,
- 0% to 5% of one or more additives, or of decomposition residues of the sacrificial phase.

Advantageously, the support made of porous composite material comprises, or better still essentially consists of, by weight relative to the total weight of the support:
- 3% to 20% of at least one polymer chosen from polyacrylonitrile, polyolefins, halogenated polymers, acrylic polymers, acrylates, methacrylates, vinyl acetates, polyethers, polyesters, polyamides, aromatic polymers, hydrogenated acrylonitrile-butadiene, ethylene/alkyl acrylate copolymers, polyisoprene, and rubbers,
- 80% to 97% of at least one filler chosen from aluminum nitride, boron nitride, magnesium silicon nitride, silicon carbide, diamond, and mixtures thereof,
- 0% to 2% of one or more additives, or of decomposition residues of the sacrificial phase.

According to one preferred embodiment of the invention, the support made of porous composite material comprises, or better still essentially consists of, by weight relative to the total weight of the support:
- 4% to 10% of at least one polymer chosen from polyacrylonitrile, polyolefins, halogenated polymers, acrylic polymers, acrylates, methacrylates, vinyl acetates, polyethers, polyesters, polyamides, aromatic polymers, hydrogenated acrylonitrile-butadiene, ethylene/alkyl acrylate copolymers, polyisoprene, and rubbers,
- 90% to 96%® of at least one filler chosen from aluminum nitride, boron nitride, magnesium silicon nitride, silicon carbide, diamond, and mixtures thereof,
- 0% to 1% of one or more additives, or of decomposition residues of the sacrificial phase.

Advantageously, this support is obtained at the end of the process described above.

The support made of porous composite material of the invention has high thermal conductivity properties owing to the presence of the thermally conductive fillers in high proportion. The support made of porous composite material of the invention has a porosity and a density that can be controlled. This is because several parameters of the process make it possible to modify these properties of the material: the proportions of the initial mixture of (A), (B), (C) and optionally the forming method, an optional compression step. The porosity can thus be controlled in terms of size, morphology and amount of pores. Depending on the applications and the stresses associated with the use, it is chosen to favor a more or less high density of the support.

The term "support made of porous composite material" is intended to mean a material of which at least 1% by volume, advantageously at least 10% by volume, consists of pores.

Advantageously, the support of the invention has a continuous porosity.

According to one embodiment of the invention, the porosity represents from 10% to 70% by volume relative to the total volume of the material, preferentially from 20% to 60%.

Preferably, a fine porosity which makes it possible to retain the PCM in the pores of the support, even when it is in the liquid state, is preferred. In addition, since the PCMs are not thermally conductive, their presence in the material reduces the thermal conductivity thereof. The choice of a fine porosity makes it possible to reduce the influence of the PCM on the thermal conductivity of the material filled with PCM.

The material is formed according to the use envisioned, in particular in the form of sheets or of films, but also of sheaths, of cables, of coatings, of granules or of casings. For example, the process of the invention provides porous composite supports in the form of spheres, which, once the porosity has been filled with PCMs, can be used for energy storage.

Advantageously, the support made of porous composite material is self-supported.

Compared with supports obtained by the solvent process, which can also be porous, the material of the invention has the advantage of being able to have varied forms, of high thickness. Indeed, the solvent process provides materials in the form of films having a maximum thickness of a few hundred microns, whereas the materials of the invention can be in any forms and have any dimensions. In the case where the material of the invention is in the form of a film, it advantageously has a thickness greater than or equal to 250 µm, preferentially greater than or equal to 500 µm, more advantageously greater than or equal to 1 mm, even better still greater than or equal to 2.5 mm.

The material of the invention is advantageously characterized in that it has, in all the directions of space, a thickness greater than or equal to 250 µm, preferentially greater than or equal to 500 µm, more advantageously greater than or equal to 1 mm.

The supports made of thermal composite material of the invention have an advantageous combination of properties: they are both porous and have a high thermal conductivity.

The Phase-Change Material

Phase-change materials have the capacity to modify their physical state in a certain temperature range. When, by heating, the melting point is reached, the phase change from the solid state to the liquid state occurs. During this melting process, the phase-change material absorbs and stores a large amount of latent heat. The temperature of the phase-change material remains virtually constant throughout the process. In a process for cooling a phase-change material, in a certain temperature range, the stored heat is released into the environment, and a reverse phase change from the liquid state to the solid state occurs. During this crystallization process, the temperature of the phase-change material also remains constant. The advantage of phase-change materials as a source of heat storage is based on the transfer of heat during the melting process and the crystallization process.

Numerous phase-change materials are known; they differ in terms of their temperature change ranges and their energy storage capacities. These materials can be used individually or as a mixture so as to modify their phase-change temperature ranges.

For example, mention may be made of: hydrocarbon-based chains such as heneicosane, eicosane, nonadecane, octadecane, heptadecane or hexadecane.

Mention may also be made of: hydrated salts such as calcium chloride hexahydrate, lithium nitrate trihydrate, or sodium sulfate decahydrate.

Mention may also be made of solvents that are liquid at ambient temperature, such as water, ethanol or acetone.

A PCM with a liquid/solid (L/S) phase transition rather than a liquid/gas (L/G) phase transition is preferably used: firstly, the L/S transition is reversible and, secondly, it makes it possible to have better control of any expansion of the material.

Preferentially, a PCM which has a phase transition temperature that is at least 20° C. below the degradation temperature of the polymer phase forming a binder is used.

The phase-change material is introduced into the support made of porous composite material by impregnation; for example, the porous composite support is immersed in the PCM in the liquid state and then removed and cooled, which makes it possible to obtain complete or almost complete filling of the porosity of the support. In a manner known to those skilled in the art, the material of the invention is characterized for its energy storage properties by differential scanning calorimetry (DSC).

Advantageously, the PCM fills at least 50%, preferentially at least 70%, even better still at least 85% by volume, relative to the total volume of the porosity of the support made of porous composite material.

One advantage of the material of the invention compared with the prior art materials, in particular the crosslinked materials, is that it is convertible and can be recycled. It is, for example, possible to eliminate the PCM phase of the material in order to recover the support made of porous composite material. It is then possible to introduce, into step a) of the process described above, the recovered support made of porous composite material based on polymer and on fillers, while adding to it a new sacrificial phase, optionally other polymers and additional fillers, and thus carry out a new conversion cycle.

The material of the invention can be used in numerous applications such as: heat dissipator in electronic equipment (heat sink), support for storage of energy produced by intermittent renewable energy sources such as solar batteries or wind turbines.

Thermally Conductive Porous Carbon-Based Material

According to one variant, the invention relates to a process for producing a thermally conductive porous carbon-based material, this process comprising
 producing a porous carbon-based support comprising at least (A) one polymer phase and (B) one or more fillers chosen from thermally conductive fillers,
 partially or totally filling the porosity of the porous carbon-based support with at least one phase-change material,
in which the production of the porous carbon-based support comprises the following steps:
 a) hot-melt mixing of the polymer phase (A), the fillers (B), and a sacrificial polymer phase (C), so as to obtain a mixture,
 b) forming of the mixture,
 c) eliminating of the sacrificial polymer phase,
 d) pyrolysis or graphitization.

Advantageously, the same characteristics as those described above for steps a), b) and c) and also for the proportions of the components are used. In a known manner, the pyrolysis treatment is carried out at a temperature greater than or equal to 500° C., the graphitization treatment at a temperature greater than or equal to 1000° C. For this, the choice of the polymer phase forming a binder must have been suitable for enabling this step. A composite carbon-based material comprising a high amount of thermally conductive fillers and having a controlled porosity and a controlled density is thus obtained.

Such a material can be used as an energy storage material in the following applications: encapsulation of electronic components, battery casings, electrical cupboards, servers.

Experimental Section

I—Materials and Methods:

I.1 Materials

Polymer Forming a Binder:

PL 1: polyacrylonitrile sold by the company Ineos under the reference Barex 210®

PL 2: HNBR (hydrogenated acrylonitrile-butadiene) elastomer sold by the company Zeon Chemicals under the reference Zetpol 2010L®

Sacrificial Polymer:

PS 1: polypropylene carbonate sold by the company Novomer under the reference Polyol 211-10®

PS 2: polypropylene carbonate sold by the company Empower Materials under the reference QPAC40®

Thermally Conductive Filler:

C1: graphite sold by the company Timcal under the reference C-therm 001©

C2: aluminum nitride

Phase-Change Material:

PCM 1: eicosane

Extruder: Coperion ZSK18

Internal mixer: 300 ml Scamex

I.2. Testing and Characterization Methods

Thermal Conductivity:

The materials were characterized at ambient temperature and in the plane by the thin-plate TPS hotdisk method according to standard NI ISO22007-2: 2008-12 plastics.

Density:

In order to evaluate the density, the weight of the material was measured on a precision balance and the volume was measured with a caliper, all of this being at ambient temperature.

Differential Scanning Calorimetry (DSC):

The enthalpies were measured on a Mettler instrument between −20° C. and 100° C. at an increase speed of 5° C./minute.

II. Polymer Compositions and Composite Materials:

In the composition tables, the "Before extraction" columns describe the proportions of the composition before step c) of eliminating the sacrificial phase, the "After extraction" columns describe the material obtained after step c).

II.1 Example 1

II.1.A Preparation of the Porous Composite Support:
Formulation:

A mixture having the following composition was prepared:

TABLE 1.1

| Composition | Before extraction | | After extraction | |
| --- | --- | --- | --- | --- |
| | % by weight | % by volume | % by weight | % by volume |
| PL1 | 13.2 | 17.4 | 19.9 | 29.1 |
| PS1 | 13.8 | 16.5 | 0 | 0 |
| PS2 | 19.8 | 23.8 | 0 | 0 |
| C1 | 53.2 | 42.3 | 80.1 | 70.9 |

Preparation Method:

Step a: Preparation of the Composition and Extrusion of a Composite Material Film The composition was prepared using a twin-screw extruder at 175° C. All the starting materials were directly injected into the extruder by means of gravimetric metering devices for powders and granules, and using an injection needle for liquids. The flow rates by weight of each component were regulated so as to obtain the composition described above.

Step b: Forming

The use of a gear pump following the twin-screw extruder made it possible to extrude continuous films 2 mm thick. The film was cut into the form of samples having dimensions of 5 cm×5 cm.

Step c: Elimination of the Sacrificial Phase

The sample of film previously obtained was subjected to a step of decomposition of the sacrificial phase in an oven under air at 230° C. for 20 min. The measurement of the difference in weight before and after the heat treatment makes it possible to monitor and to control the elimination of the polypropylene carbonate. 100% of the polypropylene carbonate initially incorporated into the mixture is decomposed and eliminated. A porous material consisting of polymer forming a binder PL1 and of filler C1 in the proportions of table 1.1, and the porosity of which represents approximately 40% by volume relative to the total volume of the material, is obtained.

Properties:

The thermal conductivity of the resulting material is 12.5 W/m·° K.

II.1.B Filling of the Porous Composite Support with a PCM:
Formulation:

The porous composite support obtained was immersed in liquid eicosane in order for the latter to fill the porosity. The material was then removed from the solution and cooled. Weight measurements were carried out before and after the contact with the eicosane. As a result of this, after calculation related to the density, 100% of the initial porosity was filled with the eicosane, giving a new composition set out in table 1.2:

TABLE 1.2

| Composition | % by weight | % by vol |
| --- | --- | --- |
| PL1 | 15.0 | 17.2 |
| C1 | 60.3 | 41.7 |
| PCM 1 | 24.7 | 41.1 |

Properties:

The material of table 1.2 was then characterized by DSC at 1 and 5° C./min in terms of temperature increase (melting) and in terms of temperature decrease (crystallization) between 0 and 100° C. in order to determine the stored enthalpy and the reversibility. An enthalpy of fusion of 80 J/g at 5° C./min is obtained. It is spread out over a range of 10° C. with a beginning of melting at 36° C. and a peak at 41° C.

II.1 Example 2

II.2.A Preparation of the Porous Composite Support:
Formulation:
A mixture having the following composition was prepared:

TABLE 2.1

| | Before extraction | | After extraction | |
|---|---|---|---|---|
| Composition | % by weight | % by volume | % by weight | % by volume |
| PL2 | 3.7 | 5.9 | 6.1 | 11.3 |
| PS1 | 25.1 | 30.7 | 0 | 0 |
| PS2 | 13.5 | 16.6 | 0 | 0 |
| C1 | 57.7 | 46.8 | 93.9 | 88.7 |

Preparation Method:
Step a: Preparation of the Composition and Formation of a Composite Material Film The composition was prepared using an internal mixer at 80° C. The polymer forming a binder PL2 and the sacrificial polypropylene PS2 were introduced and mixed first in order to obtain a plasticized molten mixture. The mineral fillers C1 were then gradually added with regular addition of the sacrificial polymer PS1 (preheating, to approximately 60° C., of the material may be required in order to decrease the viscosity thereof and to facilitate the addition) until a homogeneous mixture was obtained.

Step b: Forming

The mixture previously obtained was then calendered in the form of a sheet 0.5 cm thick. The film obtained was cut into the form of samples having dimensions of 5 cm×5 cm.

Step c: Elimination of the Sacrificial Phase

The sample of film previously obtained was subjected to a step of decomposition of the sacrificial phase in an oven under air at 230° C. for 20 min. The measurement of the difference in weight before and after the heat treatment makes it possible to monitor and to control the elimination of the polypropylene carbonate. 100% of the polypropylene carbonate initially incorporated into the mixture is decomposed and eliminated. An expansion of the volume of the material is observed during this step. A porous material consisting of polymer forming a binder PL2 and of filler C1 in the proportions of table 2.1 is obtained.

Step d: Compression

The mixture is compressed in a press at 80° C. and 50 bar until a film thickness of 0.5 cm is obtained so as to once again have the original thickness. This is because, during the decomposition, a slight swelling of the mixture is observed. The material after compression has a density of 0.844 g/cm$^3$ instead of a theoretical density of 1.80 g/cm$^3$ (the theoretical density is calculated on the basis of the formulation and the density of each element). It is deduced from the measurement of the density that the material has a porosity of 53% by volume relative to the total volume of the material.

Properties:

At the end of step d, the thermal conductivity of the material is measured in the radial direction and in the axial direction. The thermal conductivities obtained are reported in table 2.2.

TABLE 2.2

| Direction | Thermal conductivity (W/m · K) |
|---|---|
| Radial | 16.0 |
| Axial | 1.49 |

It is observed that the material obtained accumulates several properties: a high thermal conductivity, an orientation of the fillers and also a low density.

II.2.B Filling of the Porous Composite Support with a PCM:
Formulation:

The material was immersed in liquid eicosane so that the latter fills the porosity. The material was then removed from the solution and cooled. Weight measurements were carried out before and after the contact with the eicosane. As a result of this, after calculation related to the density, approximately 90% of the initial porosity was filled with the eicosane, giving a new composition presented in table 2.3:

TABLE 2.3

| Composition | % by weight | % by volume |
|---|---|---|
| PL2 | 8.2 | 6 |
| C1 | 63.9 | 47.1 |
| PCM 1 | 27.9 | 46.9 |

Properties:

The material of table 2.3 was then characterized by DSC at 1 and 5° C./min in terms of temperature increase (melting) and in terms of temperature decrease (crystallization) between 0 and 100° C. in order to determine the stored enthalpy and the reversibility. An enthalpy of fusion of 85 J/g at 5° C./min is obtained. It is spread out over a range of 10° C. with a beginning of melting at 36° C. and a peak at 39° C.

II.3 Example 3

II.3.A Preparation of the Porous Composite Support:
Formulation:
A mixture having the following composition ("Before extraction" column) was prepared:

TABLE 3.1

| | Before extraction | | After extraction | |
|---|---|---|---|---|
| Composition | % by weight | % by vol | % by weight | % by vol |
| PL2 | 4.2 | 9.0 | 5.0 | 15.0 |
| PS1 | 7.7 | 20.0 | 0 | 0 |
| PS2 | 7.6 | 20.0 | 0 | 0 |
| C2 | 80.5 | 51.0 | 95.0 | 85.0 |

Preparation Method:
Step a: Preparation of the Composition and Formation of a Composite Material Film The process was carried out as in step a of example 2.

Step b: Forming

The mixture obtained was then calendered in the form of a sheet 1 cm thick.

Step c: Elimination of the Sacrificial Phase

The process was carried out as in step c of example 2. No expansion in volume of the material during this step is to be noted. A porous material consisting of polymer forming a binder PL2 and of filler C2 in the proportions of table 3.1 is obtained.

Properties:

During the heat treatment, the elimination of the polypropylene carbonate was measured by difference in weight. 100% of the polypropylene carbonate initially incorporated into the mixture is decomposed.

II.3.B Filling of the Porous Composite Support with a PCM:

Formulation:

The material was immersed in liquid eicosane so that the latter fills the porosity. The material was then removed from the solution and cooled. Weight measurements were carried out before and after the contact with the eicosane. As a result of this, after calculation related to the density, approximately 90% of the initial porosity was filled with the eicosane, giving a new composition presented in table 3.3:

TABLE 3.3

| Composition | by weight | % by vol |
|---|---|---|
| PL2 | 4.2 | 9.1 |
| C2 | 80.7 | 51.3 |
| PCM 1 | 15.1 | 39.6 |

Properties:

The material of table 3.3 was then characterized by DSC at 1 and 5° C./min in terms of temperature increase (melting) and in terms of temperature decrease (crystallization) between 0 and 100° C. in order to determine the stored enthalpy and the reversibility. An enthalpy of fusion of 45 J/g at 5° C./min is obtained. It is spread out over a range of 10° C. with a beginning of melting at 39° C. and a peak at 41° C.

The invention claimed is:

1. A material comprising:
a support made of porous composite material comprising at least (A) one polymer phase forming a binder based on at least one polymer chosen from thermoplastic polymers, elastomers and thermoplastic elastomers, and (B) one or more fillers chosen from thermally conductive fillers,
the pores of the support made of porous composite material being partially or totally filled with at least one phase-change material, wherein the phase-change material is chosen from hydrocarbon-based chains,
wherein the support made of porous composite material has an open porosity and the phase-change material forms a continuous phase in the pores of the support, and the support made of porous composite material is self-supported and comprises, by weight relative to the total weight of the support:
3% to 20% of at least one polymer chosen from thermoplastic polymers, elastomers and thermoplastic elastomers,
80% to 97% of at least one filler chosen from thermally conductive fillers,
0% to 2% of one or more additives, or of decomposition residues of the sacrificial phase.

2. The material as claimed in claim 1, wherein the support made of porous composite material comprises, by weight relative to the total weight of the support:
4% to 10% of at least one polymer chosen from thermoplastic polymers, elastomers and thermoplastic elastomers,
90% to 96% of at least one filler chosen from thermally conductive fillers,
0% to 1% of one or more additives, or of decomposition residues of a sacrificial phase.

3. The material as claimed in claim 1, wherein the polymer phase forming a binder is based on at least one polymer chosen from: polyacrylonitrile, polyolefins, halogenated polymers, acrylic polymers, acrylates, methacrylates, vinyl acetates, polyethers, polyesters, polyamides, aromatic polymers, hydrogenated acrylonitrile-butadiene, ethylene/alkyl acrylate copolymers, polyisoprene, and rubbers.

4. The material as claimed in claim 1, wherein the fillers are chosen from: aluminum nitride, boron nitride, magnesium silicon nitride, silicon carbide, diamond, graphite, graphene, carbon nanotubes (CNTs), carbon black, metal fillers, and mixtures thereof.

5. The material as claimed in claim 1, wherein the porosity represents at least 40% by volume relative to the total volume of the support made of porous composite material.

6. A process for producing a material as claimed in claim 1, comprising:
producing a support made of porous composite material comprising at least (A) one polymer phase and (B) one or more fillers chosen from thermally conductive fillers,
the production of the support made of porous composite material comprising the following steps:
a) hot-melt mixing of the polymer phase (A), the fillers (B), and a sacrificial polymer phase (C), so as to obtain a mixture,
b) forming of the mixture,
c) eliminating of the sacrificial polymer phase, and
partially or totally filling the porosity of the support made of porous composite material with the at least one phase-change material.

7. The process as claimed in claim 6, wherein the sacrificial polymer phase (C) represents at least 15% by weight of the total weight of the mixture of step a).

8. The process as claimed in claim 7, wherein the sacrificial polymer phase (C) represents from 20% to 80% by weight of the total weight of the mixture of step a).

9. The process as claimed in claim 6, wherein step a) is carried out in an internal mixer or in an extruder.

10. The process as claimed in claim 6, wherein step c) is carried out by heat decomposition of the sacrificial polymer phase.

11. The process as claimed in claim 10, wherein the sacrificial polymer phase is based on at least one polymer chosen from polyalkene carbonates.

12. The process as claimed in claim 11, wherein the sacrificial polymer phase is based on at least one polymer chosen from polyethylene carbonates and polypropylene carbonates.

13. The process as claimed in claim 6, wherein step b) comprises shaping in the form of a film.

14. The process as claimed in claim 6, which also comprises a compression step d) at the end of step c).

15. The material as claimed in claim 1, wherein it is an energy storage material.

16. The material as claimed in claim 15, wherein it is a heat dissipator in electronic equipment.

17. The material as claimed in claim 15, wherein it is an energy storage support.

\* \* \* \* \*